US012389722B2

(12) United States Patent
Shimoda

(10) Patent No.: US 12,389,722 B2
(45) Date of Patent: Aug. 12, 2025

(54) LIGHT-EMITTING DEVICE AND METHOD FOR MANUFACTURING LIGHT-EMITTING DEVICE

(71) Applicant: STANLEY ELECTRIC CO., LTD., Tokyo (JP)

(72) Inventor: Yoichi Shimoda, Tokyo (JP)

(73) Assignee: STANLEY ELECTRIC CO., LTD., Tokyo (JP)

(*) Notice: Subject to any disclaimer, the term of this patent is extended or adjusted under 35 U.S.C. 154(b) by 447 days.

(21) Appl. No.: 18/011,803

(22) PCT Filed: Jun. 1, 2021

(86) PCT No.: PCT/JP2021/020854
§ 371 (c)(1),
(2) Date: Dec. 20, 2022

(87) PCT Pub. No.: WO2021/261182
PCT Pub. Date: Dec. 30, 2021

(65) Prior Publication Data
US 2023/0246140 A1 Aug. 3, 2023

(30) Foreign Application Priority Data

Jun. 22, 2020 (JP) ................. 2020-106785

(51) Int. Cl.
H10H 20/85 (2025.01)
H10H 20/01 (2025.01)
(Continued)

(52) U.S. Cl.
CPC ........ H10H 20/8506 (2025.01); H10H 20/84 (2025.01); H10H 20/857 (2025.01); H10H 20/034 (2025.01); H10H 20/0364 (2025.01)

(58) Field of Classification Search
CPC .. H10H 20/8506; H10H 20/84; H10H 20/857; H10H 20/034; H10H 20/0364;
(Continued)

(56) References Cited

U.S. PATENT DOCUMENTS 7,427,806 B2 * 9/2008 Arndt ................. H10H 20/8506
257/E33.059
8,093,619 B2 * 1/2012 Hayashi ............. H10H 20/8506
438/26
(Continued)

FOREIGN PATENT DOCUMENTS

CN 103178193 A 6/2013
JP 2016219522 A 12/2016
(Continued)

OTHER PUBLICATIONS

International Search Report (ISR) (and English translation thereof) dated Aug. 31, 2021, issued in International Application No. PCT/JP2021/020854.
(Continued)

Primary Examiner — Earl N Taylor
(74) Attorney, Agent, or Firm — Holtz, Holtz & Volek PC

(57) ABSTRACT

A light-emitting device includes a plurality of plate-shaped base materials, an insulating coating film, and at least one light-emitting element. The base materials are arranged side by side to be mutually spaced. The insulating coating film is formed to cover an upper surface and a side surface of each of the plurality of base materials. The coating film is provided with an opening portion that exposes one region of the upper surface of one base material and includes a binding portion mutually binding the plurality of base materials. The at least one light-emitting element is placed on the one region. The coating film includes a thin film portion in which
(Continued)

the coating film is formed in a thin film to surround an outer peripheral end of the opening portion.

8 Claims, 7 Drawing Sheets

(51) Int. Cl.
*H10H 20/84* (2025.01)
*H10H 20/857* (2025.01)

(58) Field of Classification Search
CPC ....... H10H 20/036; H01L 24/45; H01L 24/48; H01L 24/83; H01L 24/85; H01L 24/92; H01L 2224/0603; H01L 2224/45144; H01L 2224/48091; H01L 2224/48247; H01L 2224/48479; H01L 2224/49111; H01L 2224/49113; H01L 2224/49175; H01L 2224/83192; H01L 2224/85186; H01L 2224/92247; H01L 2924/12041; H01L 24/00; H01L 33/62; H01L 33/486; H01L 33/44; H01L 2933/0066; H01L 2933/0033; H01L 2933/0025
See application file for complete search history.

(56) References Cited

U.S. PATENT DOCUMENTS

| | | | | |
|---|---|---|---|---|
| 9,331,255 B2* | 5/2016 | Kräuter | ................ | H10H 20/856 |
| 9,748,448 B2* | 8/2017 | Kobayakawa | ..... | H10H 20/8506 |
| 9,905,521 B2* | 2/2018 | Yuasa | ..................... | H01L 24/05 |
| 2001/0022390 A1* | 9/2001 | Waitl | ...................... | H10F 77/50 |
| | | | | 438/106 |
| 2005/0280017 A1* | 12/2005 | Oshio | .................. | H10H 20/857 |
| | | | | 257/99 |
| 2006/0043401 A1* | 3/2006 | Lee | ......................... | H01L 24/97 |
| | | | | 257/99 |
| 2010/0304535 A1 | 12/2010 | Chen et al. | | |
| 2011/0121336 A1* | 5/2011 | Bogner | ............. | H10H 20/8506 |
| | | | | 257/98 |
| 2019/0074422 A1* | 3/2019 | Lee | .................... | H10H 20/8585 |
| 2019/0181305 A1 | 6/2019 | Huang | | |

FOREIGN PATENT DOCUMENTS

| | | |
|---|---|---|
| JP | 2019047123 A | 3/2019 |
| JP | 2019102559 A | 6/2019 |
| WO | 2008081794 A1 | 7/2008 |

OTHER PUBLICATIONS

Written Opinion dated Aug. 31, 2021, issued in International Application No. PCT/JP2021/020854.

Extended European Search Report (EESR) dated May 13, 2024, issued in counterpart European Application No. 21829100.3.

* cited by examiner

LIGHT-EMITTING DEVICE AND METHOD FOR MANUFACTURING LIGHT-EMITTING DEVICE

TECHNICAL FIELD

The present invention relates to a light-emitting device and a method for manufacturing a light-emitting device.

BACKGROUND ART

There has been known a light-emitting device using a light-emitting element, such as a Light Emitting Diode (LED) or a Laser Diode (LD) as a light source.

For example, WO-A1-2008/081794 discloses a light-emitting device including a light-emitting element, first and second lead frames, and first and second resin formed bodies. WO-A1-2008/081794 discloses that the light-emitting element is arranged in a predetermined arrangement region on the first lead frame in a casing formed as a molding.

DISCLOSURE OF THE INVENTION

Problems to be Solved by the Invention

However, when an area of the arrangement region of the light-emitting element formed on the lead frame is significantly different from an area of the light-emitting element arranged in the region like the light-emitting device disclosed in WO-A1-2008/081794, the light-emitting element cannot be self-aligned, and the light-emitting element possibly deviates from a desired position. That is, the deviation of the arrangement position of the light-emitting element possibly causes a misalignment of an optical axis of a light emitted from the light-emitting device.

The present invention has been made in consideration of the above-described points, and an object of which is to provide a light-emitting device and a method for manufacturing a light-emitting device capable of suppressing a positional deviation in bonding a light-emitting element on an arrangement region and stably bonding the light-emitting element to a predetermined position.

Solutions to the Problems

A light-emitting device according to the present invention includes a plurality of plate-shaped base materials, an insulating coating film, a placing pad, and at least one light-emitting element. The plurality of plate-shaped base materials are arranged side by side to be mutually spaced. The plurality of base materials are each made of a metal. The insulating coating film is formed so as to cover an upper surface and a side surface of each of the plurality of base materials. The coating film is provided with an opening portion that exposes one region of the upper surface of one base material among the plurality of base materials. The coating film includes a binding portion mutually binding the plurality of base materials. The placing pad is disposed so as to cover the one region of the upper surface of the one base material. The placing pad is made of a metal. The at least one light-emitting element is placed on the placing pad via a bonding member. The coating film includes a thin film portion in which the coating film is formed in a thin film so as to surround an outer peripheral end of the opening portion.

A method for manufacturing a light-emitting device according to the present invention includes: a substrate forming step of funning a plurality of plate-shaped base materials that are arranged side by side to be mutually spaced and are each made of a metal, and forming an insulating coating film formed so as to cover an upper surface and a side surface of each of the plurality of base materials, the coating film being provided with an opening portion that exposes one region of the upper surface of one base material among the plurality of base materials, the coating film including a binding portion mutually binding the plurality of base materials; a plating step of providing a placing pad made of a metal so as to cover the one region of the upper surface of the one base material; and an element bonding step of placing at least one light-emitting element on the placing pad via a bonding member. In the substrata forming step, a thin film portion in which the coating film is formed in a thin film so as to surround an outer peripheral end of the opening portion is formed in the coating film.

DESCRIPTION OF PREFERRED EMBODIMENTS

Figure 1:
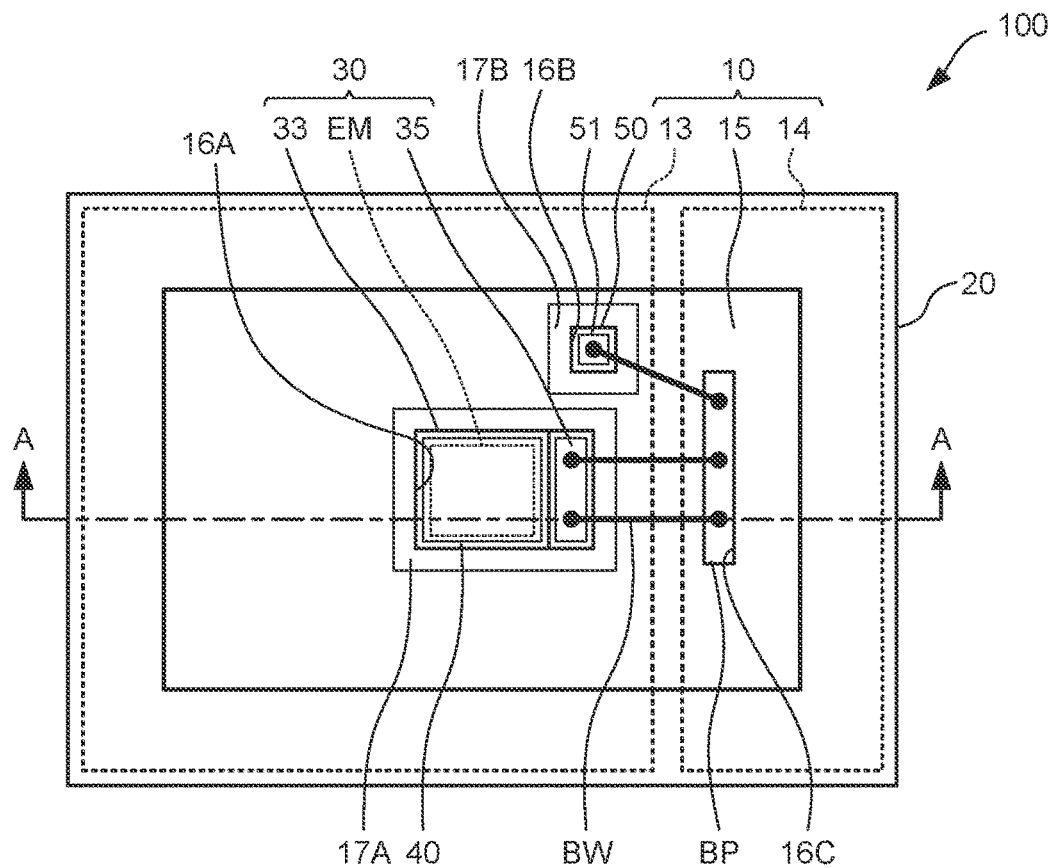
FIG. 1 is a top view of a light-emitting device according to an embodiment of the present invention.

An embodiment of the present invention will be described in detail below. Note that the same reference numerals are given to substantially the same or equivalent parts in the following description and the accompanying drawings.

Figure 2:
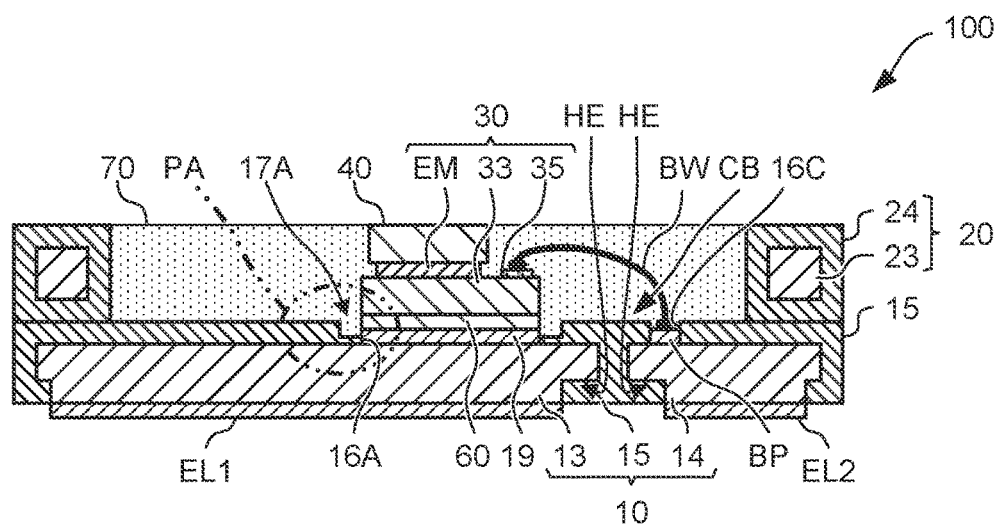
FIG. 2 is a cross-sectional view of the light-emitting device taken along a line A-A of FIG. 1.

FIG. 1 is a schematic top view of a light-emitting device 100. FIG. 2 is a cross-sectional view of the light-emitting device 100 taken along a line A-A of FIG. 1. In the following description, a description of "material 1/material 2" means a laminated structure in which a material 2 is laminated on a material 1. A description of "material 1-material 2" means an alloy of materials 1 and 2, and a description of "material 1-material 2-material 3" means an alloy of materials 1 to 3. In the description indicating an alloy, "-" is omitted in some cases. Specifically, it is described as "material1material2material3."

As illustrated in FIG. 1 and FIG. 2, the light-emitting device 100 includes a substrate 10, and the substrate 10 includes a plate-shaped first base material 13 and a second base material 14, and an insulating first coating film 15. The first base material 13 and the second base material 14 are made of copper (Cu) and arranged side by side to be mutually spaced. The insulating first coating film 15 covers them, and is a resin material made of a modified polyamide-imide. The first base material 13 and the second base material 14 are integrally covered with the insulating first coating film 15. Specifically, the first coating film 15 is formed so as to cover upper surfaces and side surfaces of the first base material 13 and the second base material 14. The first coating film 15 is filled in a clearance region between the first base material 13 and the second base material 14, and mutually facing side surfaces of the first base material 13 and the second base material 14 are bound in the clearance region. That is, the first base material 13 and the second base material 14 are bonded together by a binding portion CB of the first coating film 15 filled in the clearance therebetween. The light-emitting device 100 includes a frame body 20 that is disposed in an outer peripheral portion on the upper surface of the substrate 10, made of a material the same as that of the first base material 13 and the second base material 14, and coated with a second coating film 24.

The light-emitting device 100 includes a light-emitting element 30 placed on an internal electrode 19 formed on the first base material, a wavelength converter 40 placed so as to cover a light emitting portion EM of the light-emitting element 30, and a protection element 50 placed on an internal electrode (not illustrated) formed on the first base material.

The first base material 13 and the second base material 14 are, for example, base materials of the substrate 10 having a rectangular planar shape in top view, and made of a metallic material such as copper (Cu). The first base material 13 and the second base material 14 are conductive bodies having a function of electrically connecting to a mounting board (not illustrated).

As described above, the first base material 13 and the second base material 14 are coated with the first coating film 15 such that the upper surfaces and the side surface are covered. The first base material 13 and the second base material 14 are provided with the clearance between the mutually facing side surfaces, and the clearance is filled with the first coating film 15. Since the first coating film 15 is an insulator, the first base material 13 and the second base material 14 are mutually electrically insulated while being mutually bound by the binding portion CB of the first coating film 15.

As illustrated in FIG. 2, the first base material 13 and the second base material 14 include, for example, recessed structures HE provided by half etching in lower surface sides of the respective side surfaces. Accordingly, since the binding area of the binding portion CB to the first base material 13 and the second base material 14 are increased, the binding strength between the first base material 13 and the second base material 14 via the binding portion CB can be enhanced.

The light-emitting device 100 includes the frame body 20 disposed in the outer peripheral portion of the upper surface of the substrate 10, and the frame body 20 includes a frame base material 23 and the second coating film 24. The frame base material 23 is, for example, a metallic material the same material as the first base material 13 and the second base material 14. The second coating film 24 is a resin material made of a modified polyamide-imide similarly to the first coating film 15, and the frame base material 23 is coated with the second coating film 24 over the whole peripheral area of the frame base material 23. That is, the substrate 10 is electrically insulated from the frame body 20. For the substrate 10 and the frame body 20, the first coating film 15 is bound to the second coating film 24 by pressurizing and heating. That is, the light-emitting device 100 is provided with a U-shaped cavity, which is open upward and formed by the substrate 10 and the frame body 20, on the upper surface.

While a case where the first base material 13, the second base material 14, and the frame base material 23 contain Cu as the main material is described in the embodiment, the material is not limited to this. For example, it is only necessary that the material is conductive and has high thermal conductivity, such as iron (Fe), aluminum (Al), iron-nickel (Fe—Ni) alloy, and iron-cobalt (Fe—Co) alloy. While a case where the first base material 13 and the second base material 14 are made of the same material as the frame base material 23 is described in the embodiment, the first base material 13 and the second base material 14 need not be made of the same material as the frame base material 23.

On the lower surfaces of the first base material 13 and the second base material 14, external electrodes EL1 and EL2 are formed. The external electrodes EL1 and EL2 are electrodes made of, for example, nickel/gold (Ni/Au), and function as external electrodes electrically connected to a mounting board.

The first coating film 15 is provided with an opening portion 16A that exposes the region on which the light-emitting element 30 is placed on the upper surface of the first base material 13. The opening portion 16A is firmed in a shape approximately the same as the light-emitting element 30, and formed so as to penetrate from the upper surface of the first coating film 15 to the upper surface of the first base material 13. In the light-emitting element 30 placement region of the upper surface of the first base material 13 exposed from the opening portion 16A, the internal electrode 19 as an element placing pad made of nickel/gold (Ni/Au) is formed. In the embodiment, a case where the light-emitting element 30 is placed in the center of the upper surface of the substrate 10, and the protection element 50 is placed in the periphery of the light emitting element 30 will be described. The first coating film 15 is provided with an opening portion 16B that exposes the upper surface of the first base material 13 in the region on which the protection element 50 is placed.

The first coating film 15 on the upper surface of the second base material 14 is provided with an opening portion 16C that exposes the upper surface of the second base material 14 in a region opposed to the light-emitting dement 30 across the binding portion CB. A bonding pad BP is disposed to the part exposed from the opening portion 16C of the second base material 14. The bonding pad BP is made of, for example, Ni/Au that is the material the same as that of the internal electrode 19.

The light-emitting element 30 is, for example, a semiconductor light-emitting element having the light emitting portion EM as a semiconductor light-emitting layer laminated on a support substrate 33 containing a conductive semiconductor as the main material. The light-emitting element 30 is bonded to the opening portion 16A of the first coating film 15 via the internal electrode 19 made of nickel/gold (Ni/Au) as the element placing portion and an element bonding layer 60 as a conductive bonding member. The light emitting portion EM has, for example, a structure in which a p-type semiconductor layer, a light-emitting layer, and a n-type semiconductor layer are laminated. The upper surface of the n-type semiconductor layer is each of the upper surfaces of the light-emitting portions EM and functions as a light extraction surface in each of the light-emitting elements 30. The p-type semiconductor layer, the light-emitting layer, and the n-type semiconductor layer are, for example, nitride semiconductors made of gallium nitride (GaN) or the like as the main material and blue color light-emitting diodes (LED) that radiate blue light from the light-emitting layers having a multiple quantum well structure. The lower surface of the light-emitting element 30 is electrically connected to the p-type semiconductor via the support substrate 33, and the lower surface of the light-emitting element 30 functions as a cathode electrode (not illustrated). That is, the cathode electrode being the lower surface of the light-emitting element 30 is electrically connected to the external electrode EL1 via the element bonding layer 60 and the internal electrode 19.

The light-emitting element 30 includes an electrode pad 35 formed so as to be spaced from the light-emitting portion EM the support substrate 33. The electrode pad 35 is electrically connected to the p-type semiconductor layer of the light-emitting portion EM and functions as an anode electrode of the light-emitting element 30. The electrode pad 35 is, for example, electrically connected to the bonding pad BP formed on the second base material 14 via conductive bonding wires BW made of gold (Au). That is, the electrode pad 35 as a cathode electrode of the light-emitting element 30 is electrically connected to the external electrode EL2 via the bonding wire BW and the bonding pad BP.

As described above, the element bonding layer 60 as a bonding member is a conductive adhesive that fixedly secures and electrically connects the light-emitting element 30 to the internal electrode 19. The element bonding layer 60 is, for example, a gold-tin alloy (AuSn alloy). Further, the element bonding layer 60 is, for example, a paste-like adhesive made of AuSn alloy particles and flux as the raw materials (hereinafter, the raw materials of the element bonding layer 60 may be simply referred to as an AuSn paste). In the embodiment, while a case where the element bonding layer 60 is made of the AuSn alloy is described, the element bonding layer 60 is not limited to this. For example, the element bonding layer 60 may be an argentum (Ag) paste or a solder paste. The element bonding layer 60 is a conductive adhesive having non-affinity to the first coating film 15.

The protection element 50 is for example, a reverse voltage protection element, such as a zener diode. When an overvoltage is applied to the light-emitting element 30 from outside (such as, static electricity), the protection element 50 operates so as to protect the light-emitting element 30. The protection element 50 includes, for example, an electrode pad 51 that functions as a cathode electrode on the upper surface of the element, and an anode electrode (not illustrated) on the lower surface of the element. Further, similarly to the light-emitting element 30, the anode electrode of the protection element 50 is bonded on the internal electrode (not illustrated) formed in the opening portion 16B of the first coating film 15 via the element bonding layer 60 the same as one used for bonding the light-emitting element 30, and the anode electrode of the protection element 50 is electrically connected to the external electrode EL1. The electrode pad 51 formed on the upper surface of the protection element 50 is electrically connected to the external electrode EL2 via the bonding wire BW and the bonding pad BP. That is, the protection element 50 is connected in parallel and in a reversed polarity to the light-emitting element 30.

In the light-emitting element 30 and the protection element 50, the bonding wire BW is configured by an aspect of what is called reverse bonding made of a wire bump and a gold wire. In the embodiment, while a case where the bonding wire BW is configured by reverse bonding is described, the aspect of the bonding wire BW is not limited to this and may be an aspect of forward bonding in which a press-bonded ball is formed on each electrode pad.

The light-emitting device 100 includes a wavelength converter 40 placed on the light-emitting element 30 so as to cover the light emitting portion EM. The wavelength converter 40 performs wavelength conversion to emitted light from the light-emitting element 30. The wavelength converter 40 is formed of a plate-shaped member containing, for example, phosphor particles containing yttrium aluminum garnet (YAG) doped with cerium (Ce) as the main material and a binder of glass or ceramic such as alumina that transmits radiation light of the light-emitting element 30 and radiation light of the phosphor particles. As the binder, YAG not doped with cerium (Ce) may be used (in this case, the wavelength converter 40 may be a polycrystal body or a single crystal body). In the embodiment, the wavelength converter 40 is a wavelength conversion plate that performs the wavelength conversion of a part of blue light radiated from the light-emitting element 30, and combines light radiated from the light-emitting element 30 and light radiated from the wavelength converter 40 to radiate white light. Performing the wavelength conversion of approximately all light radiated from the light-emitting element 30 by the wavelength converter 40 allows converting the light radiated from the wavelength converter 40 that is exposed to the outside of the light-emitting device 100 into green light, yellow light, red light, infrared light, and the like that correspond to the radiation light of the wavelength converter 40.

In the embodiment, the wavelength converter 40 has one main surface that is bonded on the upper surface of the light-emitting element 30 via an adhesive resin (not illustrated) as an adhesive resin layer that transmits the light radiated from the light-emitting element 30. Further, the other main surface faces to the outside of the light-emitting device 100 so as to be exposed. That is, the one main surface of the wavelength converter 40 functions as a light-receiving surface that receives the light emitted by the light-emitting element 30 via the adhesive resin, and the other main surface functions as a light extraction surface of the light-emitting device 100.

As illustrated in FIG. 2, the light-emitting device 100 includes a coating member 70 filled in the cavity formed by the substrate 10 and the frame body 20 so as to expose the upper surface as the light extraction surface of the wavelength converter 40. The coating member 70 contains, for example, a resin material having reflectivity. In the embodiment, the coating member 70 is a white resin that reflects the light emitted from the light-emitting element 30 and the light emitted from the wavelength converter 40. In FIG. 1, the coating member 70 is omitted for clearly illustrating the structures and the positional relationship of the respective components.

The light-emitting device 100 includes a thin film region 17A in which the first coating film 15 is formed in a thin film in an outer peripheral portion of the opening portion 16A of the first coating film 15. The thin film region 17A has a function of easily performing self-alignment when the light-emitting element 30 is placed on the paste-like element bonding layer 60 applied over the upper surface of the internal electrode 19 and the element bonding layer 60 is heated to be melted.

The opening portion 16A of the first coating film 15 is opened in a shape approximately the same shape as the element to be placed, such as the light-emitting element 30. Assuming that the thin film region 17A is not formed around the opening portion 16A of the first coating film 15, an interference between the light-emitting element 30 and the first coating film 15 occurs or the light-emitting element 30 runs over the end portion of the coating film due to the positional deviation or the like in placing the element, thereby possibly causing a poor bonding.

Therefore, forming the thin film region 17A on the outer periphery of the opening portion 16A of the first coating film 15 and using the element bonding layer 60 (AuSn paste) having the non-affinity to the first coating film 15 allow the element to be placed to easily perform the self-alignment. Accordingly, the light-emitting element 30 can be stably placed on the substrate 10 without causing the positional deviation of the light-emitting element 30 placed on the substrate. Also in the opening portion 16B on which the protection element 50 is placed, a thin film region 17B is similarly formed.

As described above, the light-emitting device 100 includes the plate-shaped first base material 13 and second base material 14, the insulating first coating film 15, the internal electrode 19, and the light-emitting element 30. The first base material 13 and second base material 14 are arranged side by side to be mutually spaced, and are each made of a metal. The first coating film 15 is formed so as to cover the upper surface and the side surface of each of the first base material 13 and the second base material 14. The first coating film 15 is provided with the opening portion 16A that exposes one region of the upper surface of the first base material 13 among the first base material 13 and the second base material 14. The first coating film 15 includes the binding portion CB binding the first base material 13 to the second base material 14. The internal electrode 19 is disposed so as to cover the one region of the upper surface of the first base material 13 and made of a metal. The light-emitting element 30 is placed on the internal electrode 19 via the element bonding layer 60. The first coating film 15 includes the thin film region 17A in which the first coating film 15 is formed in a thin film so as to surround the outer peripheral end of the opening portion 16A.

The first coating film 15 is made of a modified polyamide-imide. The first coating film 15 has a non-affinity to the element bonding layer 60 one another.

The height from the upper surface of the first base material 13 to the bottom surface of the light-emitting element 30 is higher than the height from the upper surface of the first base material 13 to the upper surface of the thin film region 17A. The light-emitting device 100 further includes the frame body 20 disposed on the outer peripheral portion of the upper surface of the first coating film 15. The frame body 20 includes the annular frame base material 23 coated with the second coating film 24. The frame base material 23 is made of the material the same as those of the first base material 13 and the second base material 14. The opening portion 16A has a shape approximately the same as the shape of the light-emitting element 30.

Here, exemplary configurations of the respective layers of the first coating film 15, the thin film region 17A, the internal electrode 19, and the element bonding layer 60 in the light-emitting device 100 will be described.

Figure 3:
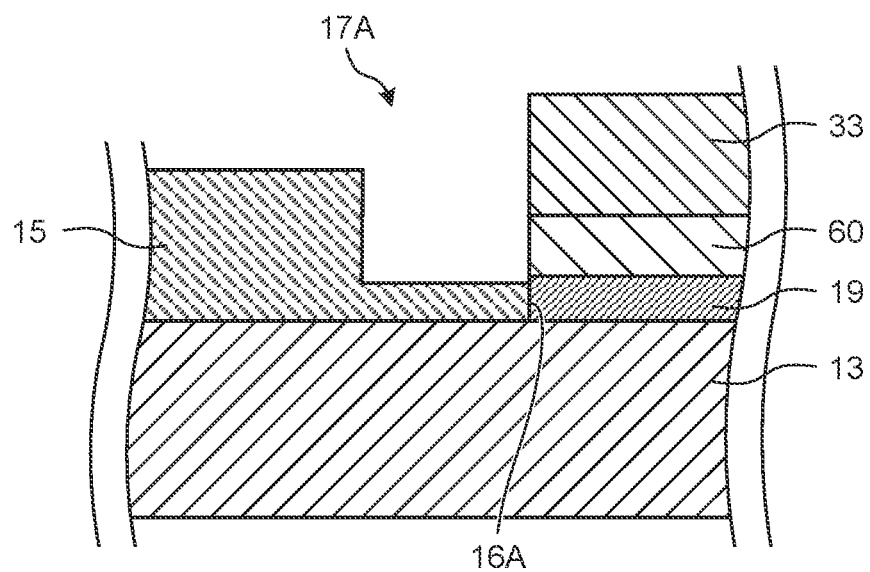
FIG. 3 is an enlarged view of a peripheral portion PA of an element placing portion of FIG. 2.

FIG. 3 is an enlarged view of a peripheral portion PA of an element placing portion of FIG. 2.

As described above, the first coating film 15 is formed on the first base material 13, and the first coating film 15 is provided with the opening portion 16A having approximately the same shape as the support substrate 33 of the light-emitting element 30 and opening so as to penetrate to the upper surface of the first base material 13. The internal electrode 19 made of Ni/Au is formed in the opening portion 16A of the first coating film 15. The support substrate 33 of the light-emitting element 30 is bonded on the internal electrode 19 via the element bonding layer 60. The thin film region 17A is formed at the outer peripheral portion of the opening portion 16A of the first coating film 15.

Here, a film thickness of the thin film region 17A from the upper surface of the first base material 13 is formed to be lower than a thickness of the element bonding layer 60 including the internal electrode 19 from the upper surface of the first base material 13.

Since the element bonding layer 60 has the non-affinity to the first coating film 15, the element bonding layer 60 does not wet-spread to the thin film region 17A outside the internal electrode 19. In other words, the element bonding layer 60 wet-spreads only over the internal electrode 19 even during the heating and melting, and has the shape similar to the opening portion 16A of the first coating film 15 (upper surface shape of the light-emitting element 30) in top view.

A height from the upper surface of the first base material 13 to the upper surface of the first coating film 15 is configured to be higher than a height including the internal electrode 19 and the element bonding layer 60 from the upper surface of the first base material 13 (height from the upper surface of the first base material 13 to the lower surface of the support substrate 33 of the light-emitting element 30).

Accordingly, it can be avoided that the light-emitting element 30 deviates from the inside of the opening including the thin film region 17A to the outside (upper surface of the first coating film 15). For example, the displacement of the light-emitting element 30 due to a vibration or the like can be avoided after the light-emitting element 30 is placed on the element bonding layer 60 by a placing machine.

Accordingly, the light-emitting element 30 is self-aligned by a surface tension having a minimum interfacial energy of the melted element bonding layer 60 between the heated and melted element bonding layer 60 and the light-emitting element 30 placed on the element bonding layer 60.

In the region where the protection element 50 is placed, the first coating film 15, the thin film region 17B, the internal electrode, and the element bonding layer 60 have the similar configurations.

While the case where the film thickness of the thin film region 17A from the upper surface of the first base material 13 is smaller than the film thickness of the internal electrode 19 is illustrated in the embodiment, the film thickness of the thin film region 17A may be thicker than the film thickness of the internal electrode 19. Specifically, it is only necessary that the height of the bottom surface of the light-emitting element 30 is higher than the height of the thin film region 17A when the AuSn paste is melt. In other words, it is only necessary to have a configuration in which the light-emitting element 30 does not contact the modified polyamide-imide of the thin film region 17A in the self-alignment of the light-emitting element 30.

In the embodiment, the case where the opening portion 16A has approximately the same shape as the support substrate 33 of the light-emitting element 30 will be described. However, the shape of the opening portion 16A may be approximately the same shape as a cathode electrode (not illustrated) on the lower surface of the light-emitting element 30. In this case also, since the height of the bottom surface of cathode electrode is higher than the height of the thin film region 17A when the AuSn paste is melted, the accurate self-alignment can be performed similarly to the embodiment.

A width in which the thin film region 17A is formed is, for example, a width providing an overlapping area that is 60% or more of an area defined by the outer shape of the light-emitting element 30 relative to the surface on which the element bonding layer 60 is formed in top view.

For example, when the outer shape of the light-emitting element 30 is a square of 1 mm×1 mm, and the outer shape of the element bonding layer 60 is a square of 1 mm×1 mm, it is only necessary to cause the width of the thin film region 17A to have 0.2 mm or less for obtaining the overlapping area of 64% or more. Thus, setting the overlapping area to 60% or more allows the self-alignment of the light-emitting element 30 on the element bonding layer 60.

In the embodiment, since the outer shape of the light-emitting element 30 is 1 mm×1 mm, the outer shape of the element bonding layer 60 is 1 mm×1 mm, and the width of the thin film region 17A is 0.04 mm, the overlapping area is 92%. Thus, setting the overlapping area to more than 90% allows the extremely accurate self-alignment. When the width of the thin film region 17A is narrowed, fan-shaped relief portions centered at intersection points of four sides defining the thin film region 17A may be provided. With the relief portions, it can be avoided that the corner portion of the light-emitting element 30 runs over the upper surface of the first coating film 15.

Next, a manufacturing procedure of the light-emitting device 100 according to the embodiment of this application will be described with reference to FIG. 4 and FIG. 5 to FIG. 15.

Figure 4:
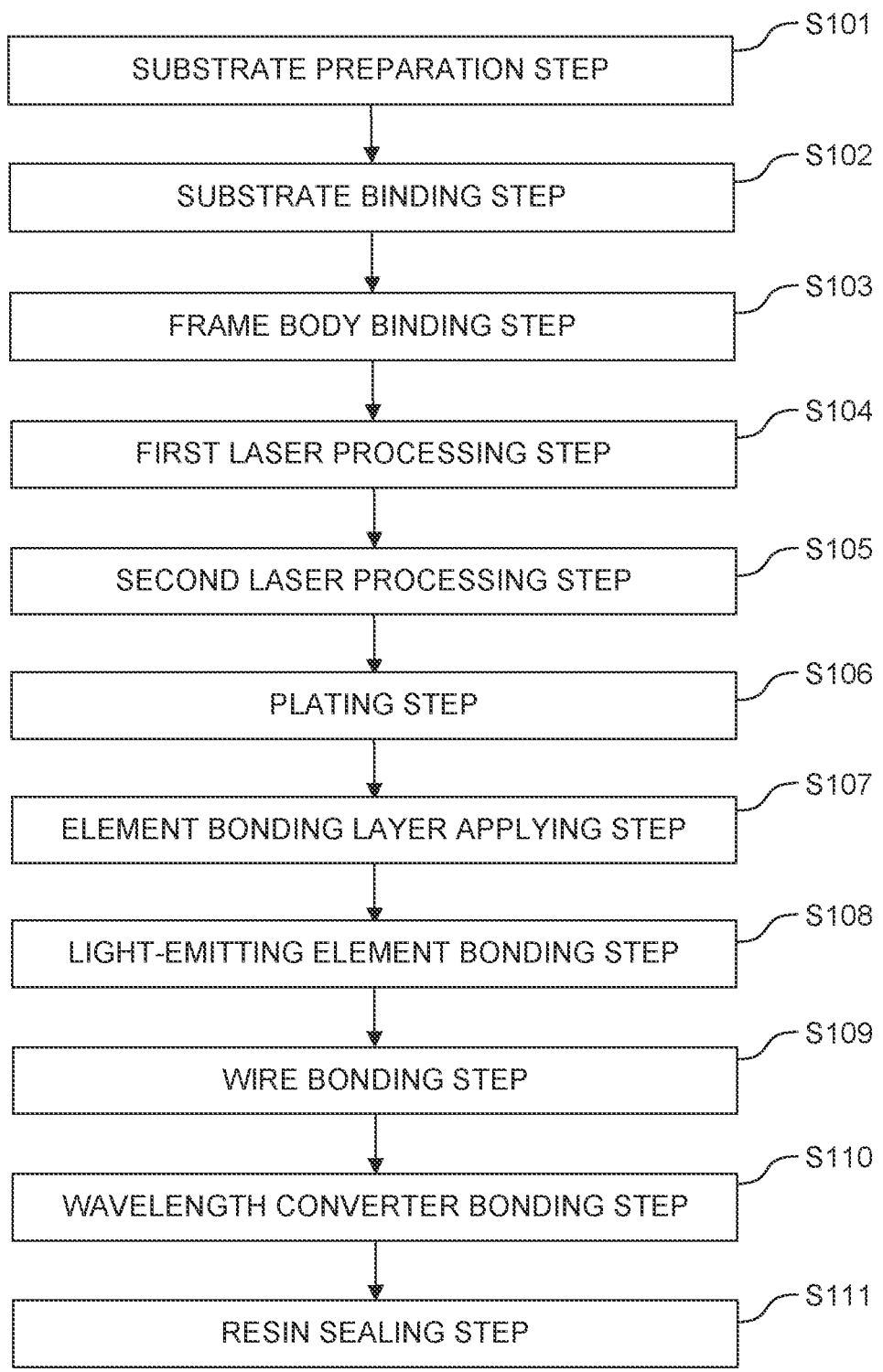
FIG. 4 is a drawing illustrating a flow chart of manufacturing the light-emitting device according to the embodiment of the present invention.

FIG. 4 is a drawing illustrating a flow chart of manufacturing the light-emitting device 100 according to the embodiment of the present invention. FIG. 5 to FIG. 15 illustrate top views of the light-emitting device 100 in respective steps of the manufacturing procedure illustrated in FIG. 4.

Figure 5:
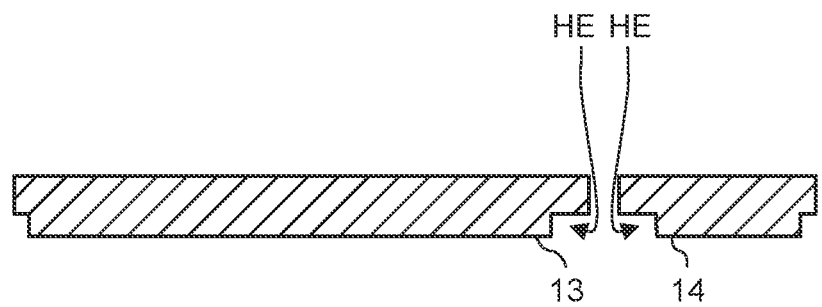
FIG. 5 is a cross-sectional view of the light-emitting device during the manufacture according to the embodiment of the present invention.

First, the plate-shaped first base material 13 and second base material 14 that are arranged side by side to be mutually spaced and made of a metal are prepared as illustrated in FIG. 5 (Step S101).

Figure 6:
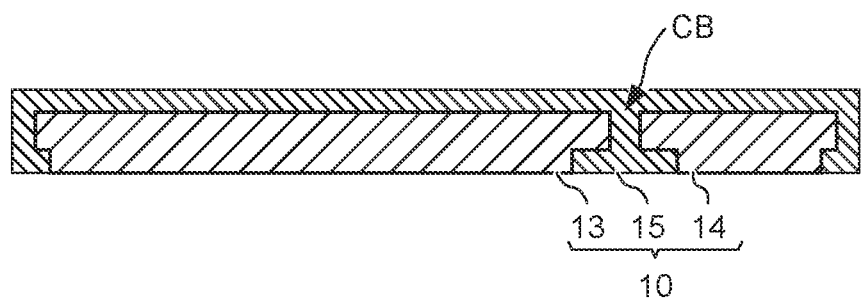
FIG. 6 is a cross-sectional view of the light-emitting device during the manufacture according to the embodiment of the present invention.

Next, as illustrated in FIG. 6, the insulating modified polyamide-imide is applied over the side surfaces and the upper surfaces of the first base material 13 and the second base material 14, thus forming the first coating film 15 and the binding portion CB (Step S102). The modified polyamide-imide is formed using electrodeposition coating. The film thickness of the modified poly amide-imide formed by the electrodeposition coating is, for example, about 20 um to 40 um. The lower surface sides of the first and second base materials 13 and 14 not to be coated with the first coating film 15 are, for example, masked in advance.

Figure 7:
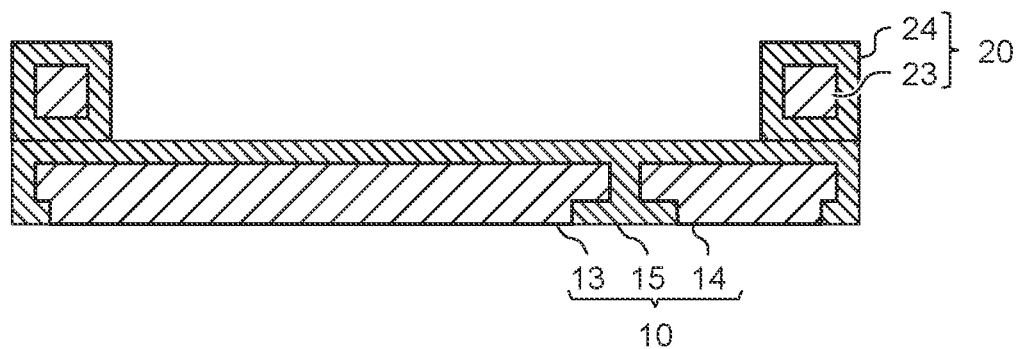
FIG. 7 is a cross-sectional view of the light-emitting device during the manufacture according to the embodiment of the present invention.

As illustrated in FIG. 7, with the method similar to the first base material 13 and the second base material 14, the frame body 20 in which the second coating film is coated over the frame base material 23 is prepared. Then, after positioning along the outer peripheral portion of the upper surface of the substrate 10, heating and pressurizing are performed to both, thereby pressure-bonding the frame body 20 to the substrate 10 (Step S103).

Figure 8:
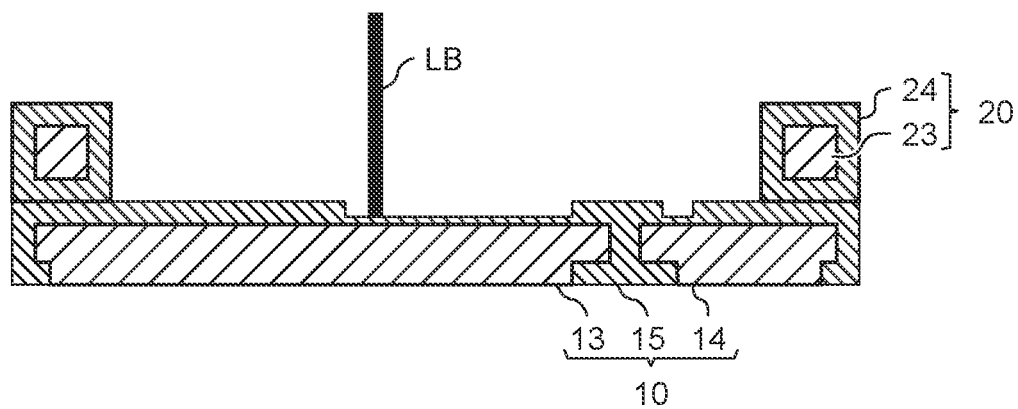
FIG. 8 is a cross-sectional view of the light-emitting device during the manufacture according to the embodiment of the present invention.

Next, as illustrated in FIG. 8, a laser beam LB is irradiated on a first region including the region in which the light-emitting element 30 is placed and the region of its outer periphery corresponding to the thin film region 17A on the upper surface of the first base material 13, and the region in which the bonding pad BP is formed on the upper surface of the second base material 14, thereby removing the first coating film 15 (Step S104). The laser beam LB for example, a laser light of Yttrium Aluminum Garnet (YAG). At this time, an output of the laser beam LB is set so as to partially leave the first coating film 15. The output is set such that the film thickness of the remaining first coating film 15 becomes the film thickness of the thin film region 17A. For example, in the removal by the laser beam LB, since the removal rate is decreased due to the heat radiation from the first and second base materials 13 and 14 as the first coating film 15 becomes thin, the setting to leave the thin film region 17A can be easily made. While the method for removing the first coating film 15 using the YAG laser as the laser beam LB is described in the embodiment, the type of the irradiated laser beam is not limited to this. Specifically, it is only necessary that the modified polyimide-imide as the first coating film 15 can be removed by the irradiation of the laser beam LB.

Figure 9:
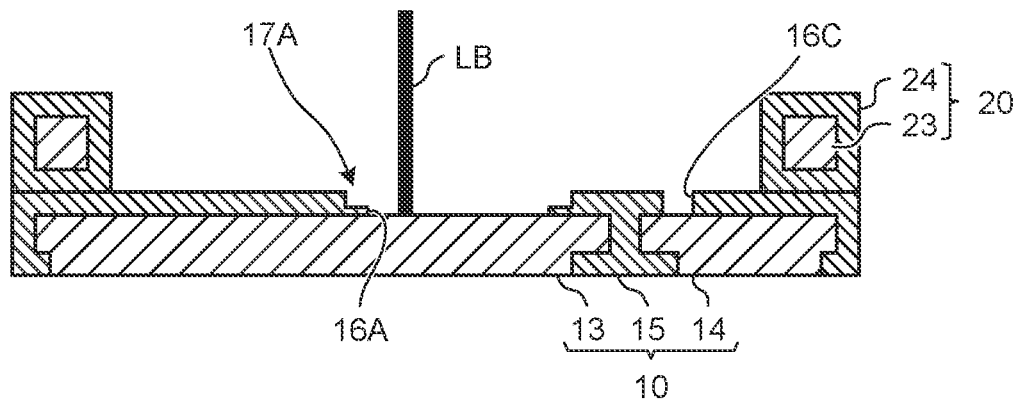
FIG. 9 is a cross-sectional view of the light-emitting device during the manufacture according to the embodiment of the present invention.

Next, as illustrated in FIG. 9, the laser beam LB is irradiated again on a second region including the region in which the light-emitting element 30 is placed on the upper surface of the first base material 13, and the region in which the bonding pad BP is formed on the upper surface of the second base material 14, thereby completely removing the first coating film 15 (Step S105). That is, the first coating film 15 is removed so as to expose the upper surfaces of the first base material 13 and the second base material 14. Accordingly, the opening portion 16A opened so as to penetrate to the first base material 13 and the thin region 17A in a thin film shape at the outer peripheral portion of the opening portion 16A can be formed on the first coating film 15 formed on the upper surface of the first base material 13. As described above, the upper surface shape of the opening portion 16A formed on the first coating film 15 is formed in approximately the same shape as the upper surface shape of the light-emitting element 30 to be placed. Similarly, in the region where the bonding pad BP is formed on the second base material 14, the opening portion 16C opened so as to penetrate to the upper surface of the second base material 14 is formed.

While the case where the opening portion 16A and the thin film region 17A are formed on the first coating film 15 by performing the laser processing step twice as described above is described in the embodiment, the number of times of performing the laser processing is not limited to this. Specifically, the process may be performed by the laser irradiation at one time while changing the output of the laser beam LB for the opening portion 16A and the thin film region 17A as needed, or the process may be performed by a plurality of times of laser irradiation, three times or more, with a predetermined laser output. In the embodiment, the case where the first coating film 15 is formed only on the upper surfaces and the side surfaces of the first base material 13 and the second base material 14 is described. However, the range of forming the first coating film 15 is not limited to this. For example, it is allowed that the first coating film 15 is formed on the whole circumferences including the lower surfaces of the first base material 13 and the second base material 14, and then, the first coating film 15 is removed by the laser irradiation in the region in which the external electrodes EL1 and EL2 are formed on the lower surfaces of the first base material 13 and the second base material 14.

Steps S101 to S105 described above are performed as a substrate forming step of forming the substrate 10.

Figure 10:
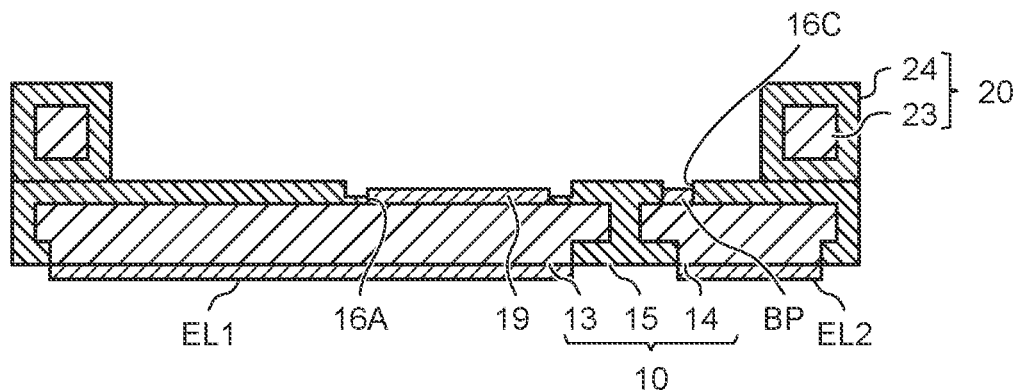
FIG. 10 is a cross-sectional view of the light-emitting device during the manufacture according to the embodiment of the present invention.

Next, as a plating step, as illustrated is FIG. 10, Ni/Au plating is performed on the substrate 10 on which the laser processing has been performed, thus forming the internal electrode 19 in the opening portion 16A on the upper surface of the first base material 13, the bonding pad BP in the opening portion 16C of the second base material 14, and the external electrodes EL1 and EL2 on the lower surfaces of the first base material 13 and the second base material 14 (Step S106).

Figure 11:
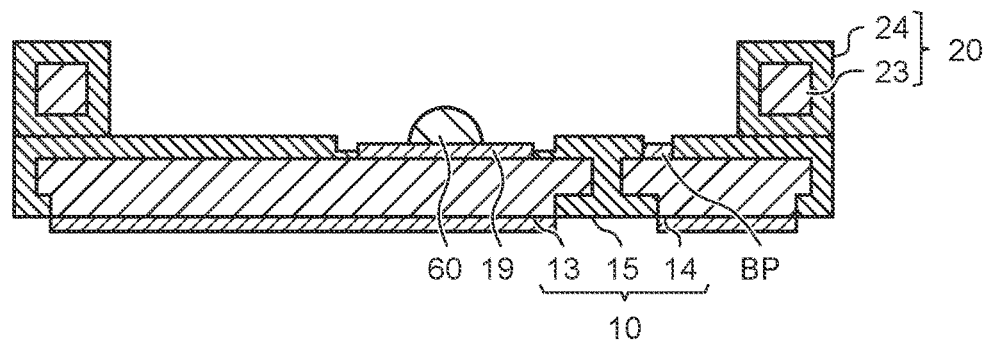
FIG. 11 is a cross-sectional view of the light-emitting device during the manufacture according to the embodiment of the present invention.

Next, as illustrated in FIG. 11, the AuSn paste as the raw material of the element bonding layer 60 is applied over the internal electrode 19 formed on the upper surface of the first base material 13 in the opening portion 16A (Step S107). When the AuSn paste is applied over the internal electrode 19, applying using a dispenser filled with the AuSn paste is preferred.

Figure 12:
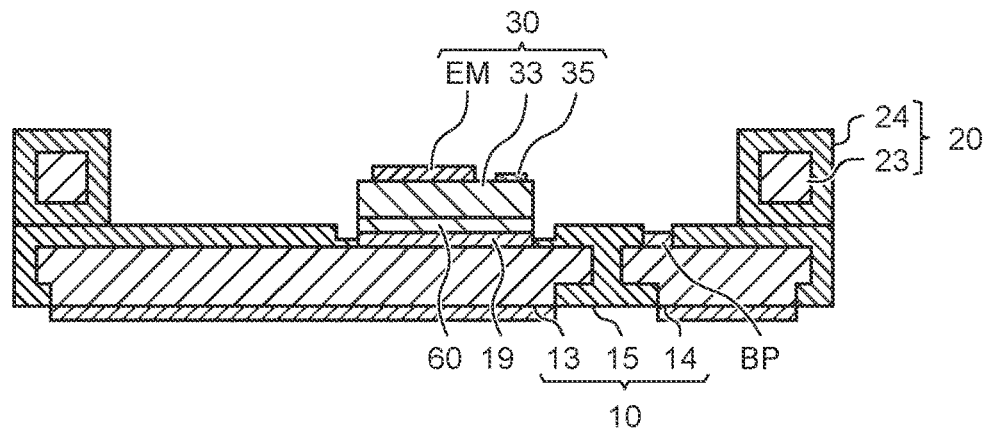
FIG. 12 is a cross-sectional view of the light-emitting device during the manufacture according to the embodiment of the present invention.

Next, as illustrated in FIG. 12, the light-emitting element 30 is placed on the element bonding layer 60 applied over the internal electrode 19 such that the cathode electrode (not illustrated) disposed on the lower surface of the light-emitting element 30 contacts the element bonding layer 60 (Step S108).

The substrate 10 in this state is, for example, heated to 300° C. in a nitrogen atmosphere to melt AuSn alloy particles in the AuSn paste, and then cooled, thereby forming the element bonding layer 60. Thus, the light-emitting element 30 is fixedly secured to the internal electrode 19 by the element bonding layer 60. The internal electrode 19 and the light-emitting element 30 are eutectically bonded is one another by the AuSn alloy, and electrically connected to one another. The position and the orientation of the secured light-emitting element 30 are, as described above, those allowing the self-alignment of the light-emitting element 30 by the surface tension of the melted element bonding layer 60. Specifically, the light-emitting element 30 is self-aligned by a surface tension having a minimum interfacial energy of the melted element bonding layer 60 between the heated and melted element bonding layer 60 and the light-emitting, element 30 placed on the element bonding layer 60. Additionally, the p-type semiconductor layer of the light emitting portion EM is electrically connected to the external electrode EL1.

Since the modified polyamide-imide used for the first coating film 15 and the binding portion CB has a heat resistance at a temperature higher than the temperature of the eutectic bonding of AuSn alloy, the failure such as degeneration is not caused even in the formation of the element bonding layer 60.

Steps S107 to S108 described above are performed as an element bonding step of bonding the light-emitting element 30 to the substrate 10.

Figure 13:
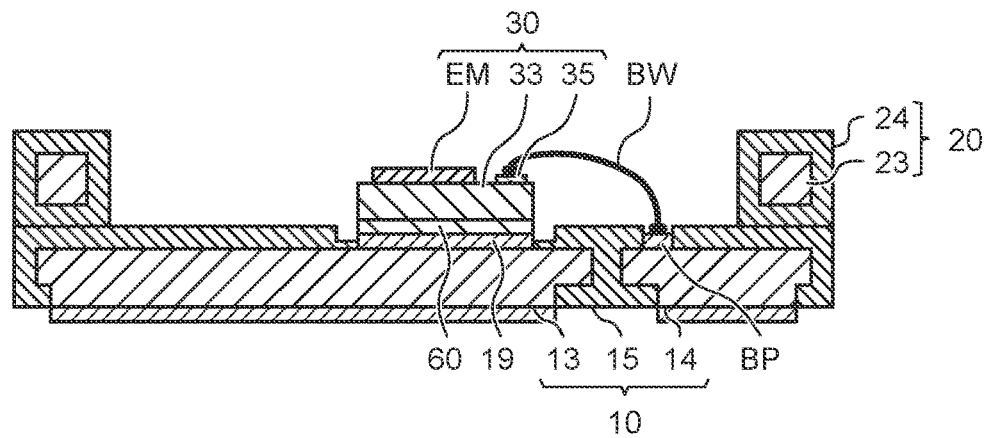
FIG. 13 is a cross-sectional view of the light-emitting device during the manufacture according to the embodiment of the present invention.

Next, as illustrated in FIG. 13, the substrate 10 to which the light-emitting element 30 is fixedly secured is set in a wire bonding machine, and the electrode pad 35 formed on the upper surface of the light-emitting element 30 is connected to the bonding pad BP formed on the second base material 14 with the bonding wire BW, such as an Au wire (Step S109). The connection by the Au wire may be the aspect of forward bonding in which a press-bonded ball is formed on the electrode pad 35, or may be the aspect of reverse bonding in which, after a wire bump is formed on the electrode pad 35, the press-bonded ball is formed on the bonding pad BP and connected to the wire bump. Thus, the n-type semiconductor layer of the light emitting portion EM is electrically connected to the external electrode EL2.

Figure 14:
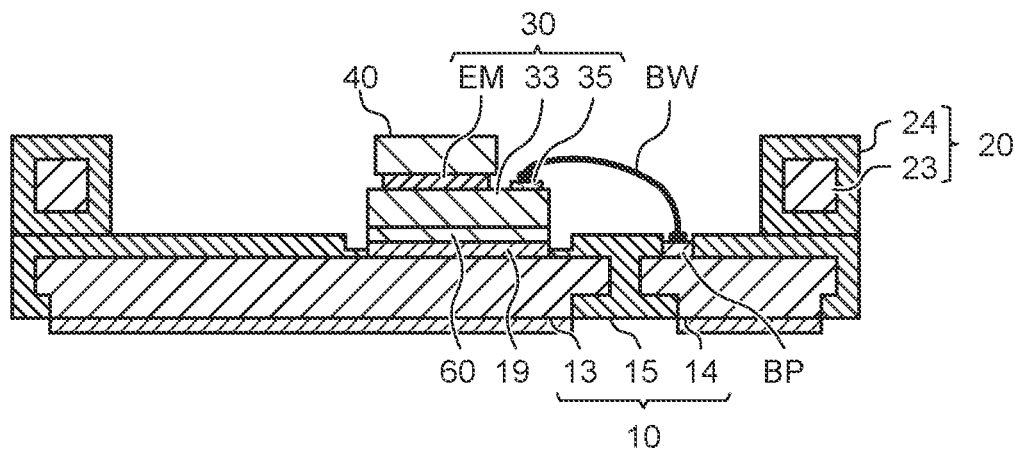
FIG. 14 is a cross-sectional view of the light-emitting device during the manufacture according to the embodiment of the present invention.

Next, as illustrated in FIG. 14, the wavelength converter 40 is placed so as to cover the light emitting portion EM of the light-emitting element 30 via a not illustrated adhesive resin, and then, heated to be fixedly secured (Step S110). The adhesive resin is preferably potted on, for example, the center position or the like of the light-emitting portion EM by a dispenser. After the potting of the adhesive resin, the wavelength converter 40 is placed on the adhesive resin. The placing position of the wavelength converter 40 is self-aligned so as to cover the upper surface of the light-emitting element 30, especially the upper surface of the light emitting portion EM by the surface tension of the adhesive resin. Afterwards, the substrate 10 in which the wavelength converter 40 is placed on the upper surface of the light-emitting element 30 is heated to cure the adhesive resin, and the wavelength converter 40 is fixedly secured on the upper surface of the light-emitting element 30.

Figure 15:
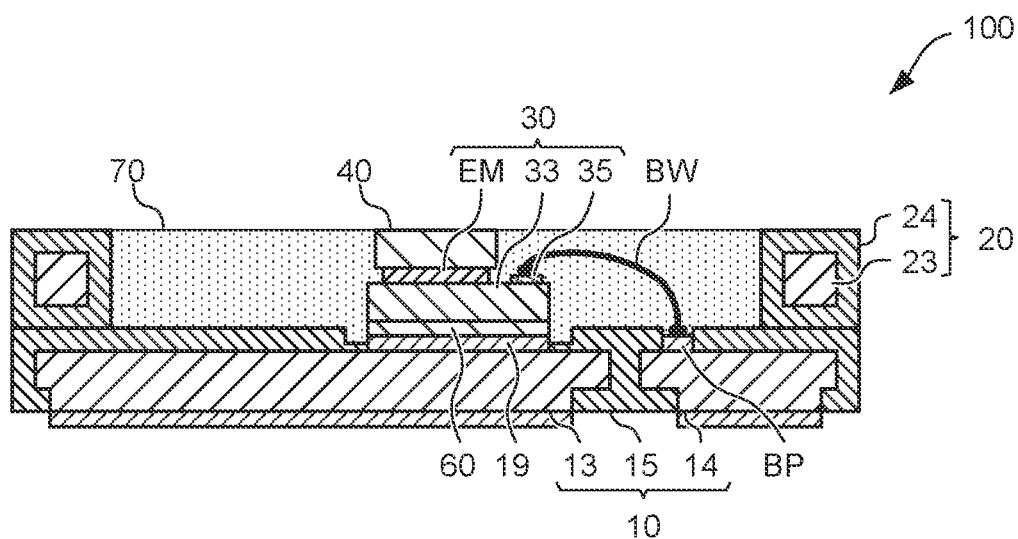
FIG. 15 is a cross-sectional view of the light-emitting device during the manufacture according to the embodiment of the present invention.

Subsequently, as illustrated in FIG. 15, the reflective coating member 70 is filled inside the cavity formed by the substrate 10 and the frame body 20, thus manufacturing the light-emitting device 100 (Step S111).

Although not illustrated, the processes of Steps S104 to S109 are performed also for the protection element 50, and the protection element 50 is bonded on the first base material 13 so as to be self-aligned by the thin film region 17B formed in the outer periphery of the opening portion 16B in the region where the protection element 50 is placed.

As described above, the method for manufacturing the light emitting device 100 includes: a substrate forming step of forming the plate-shaped first base material 13 and second base material 14 that are arranged side by side to be mutually spaced and are each made of a metal, and forming the insulating first coating film 15 formed so as to cover the upper surface and the side surface of each of the first base material 13 and the second base material 14, the first coating film 15 being provided with the opening portion 16A that exposes one region of the upper surface of the first base material 13 among the first base material 13 and the second base material 14, the first coating film 15 including the binding portion CB binding the first base material 13 to the second base material 14; a plating step of providing the internal electrode 19 made of a metal so as to cover the one region of the upper surface of the first base material 13; and an element bonding step of placing the light-emitting element 30 on the internal electrode 19 via the element bonding layer 60. In the substrate forming step, the thin film region 17A in which the first coating film 15 is formed in a thin film so as to surround the outer peripheral end of the opening portion 16A is formed in the first coating film 15.

The first coating film 15 and the binding portion CB are formed on the first base material 13 and the second base material 14 by electrodeposition coating.

The thin film region 17A and the opening portion 16A of the first coating film 15 are formed by removing the first coating film 15 by the irradiation of the laser beam LB to the first coating film 15, the thin film region 17A is formed by irradiating a laser irradiation region including the one region of the first coating film 15 and extending outward from the peripheral area of the one region with the laser beam LB, and the opening portion 16A is formed by irradiating the one region in a laser irradiation region with the laser beam LB again to partially remove the thin film region 17A.

According to the embodiment, in the light-emitting device 100, in the region, in which the light-emitting element 30 is placed, of the insulating first coating film 15 coated over the upper surface of the first base material 13, the first coating film 15 is provided with the opening portion 16A having approximately the same shape as the light-emitting element 30 to be placed and penetrating to the upper surface of the first base material 13. The thin film region 17A provided by forming the first coating film 15 in a thin film is disposed on the upper surface of the first base material 13 in the outer peripheral portion of the opening portion 16A. The film thickness of the thin film region 17A is smaller than the thickness from the upper surface of the first base material 13 to the bottom surface of the light-emitting element 30. With this configuration, even when the placing position is displaced in placing the light-emitting element 30, the poor bonding due to the contact of the light-emitting element 30 with the first coating film 15 or the like can be avoided, thus allowing surely performing the self-alignment during heating.

Accordingly, the present invention can provide the light-emitting device 100 capable of stably placing the light-emitting element 30 on the substrate 10 without causing the positional deviation of the light-emitting element 30 placed on the substrate 10, and provide the method for manufacturing the light-emitting device 100.

While the case where the light emitting portion EM of the light-emitting element 30 is a blue LED containing a nitride semiconductor as a main material is described in the embodiment, the material of the light emitting portion EM is not limited to this, and various kinds of LED emitting lights of other colors and a semiconductor light-emitting layer of laser are applicable. Specifically, it is only necessary for the light-emitting element 30 that the light emitting portion EM and the electrode pad 35 are placed side by side on the support substrate 33.

In the embodiment, the light-emitting device 100 including the wavelength converter 40 configured to perform the wavelength conversion of a light radiated from the light-emitting element 30 upon excitation by the radiated light is described. However, the wavelength converter 40 may be a translucent plate that does not perform the wavelength conversion of the light radiated from the light-emitting element 30.

In the embodiment, the case where the light-emitting device 100 includes one light-emitting element 30 is described. However, the number of the light-emitting elements 30 to be mounted is not limited to this. Specifically, a plurality of two or more light-emitting elements may be mounted on the first base material 13. In this case, the plurality of light-emitting elements are configured to be connected in parallel to the external electrode.

In addition to the above-described configuration, for the base material constituting the substrate 10, three or more base materials may be included. In this case, the light-emitting device 100 may have a configuration in which a base material including an external electrode on a lower surface thereof and a base material without an external electrode on a lower surface thereof are prepared, and a plurality of light-emitting elements are connected in series to the respective base materials. The light-emitting device may include a plurality of light-emitting elements connected in parallel and each including an external electrodes on a lower surface thereof.

When the light-emitting device includes a plurality of light-emitting elements, as the wavelength converter 40, a wavelength converter may be disposed to each of the plurality of light-milting elements. Wavelength converters integrally formed so as to cover the respective light emitting portions EM of a plurality of light-emitting elements may be disposed while the plurality of light-emitting elements are placed side by side in a specific arranging direction.

A plurality of light-emitting elements may be placed side by side in a specific arranging direction, and wavelength converters may be disposed for of the respective plurality of light-emitting elements. In this case, wavelength conversion plates excited by lights radiated from the light-emitting elements to perform the wavelength conversion into white lights and wavelength conversion plates excited by lights radiated from the light-emitting elements 30 to perform the wavelength conversion into orange lights may be alternately disposed for the plurality of respective light-emitting elements. This allows toning the light emitted from the light extraction surface of the light-emitting device 100.

What is claimed is:

1. A light-emitting device comprising:
   a plurality of plate-shaped base materials that are arranged side by side to be mutually spaced and are each made of a metal;
   an insulating coating film formed so as to cover an upper surface and a side surface of each of the plurality of base materials, the coating film being provided with an opening portion that exposes one region of the upper surface of one base material among the plurality of base materials, the coating film including a binding portion mutually binding the plurality of base materials;
   a placing pad disposed so as to cover the one region of the upper surface of the one base material, the placing pad being made of a metal; and
   at least one light-emitting element placed on the placing pad via a bonding member,
   wherein the coating film includes a thin film portion in which the coating film is formed in a thin film so as to surround an outer peripheral end of the opening portion.

2. The light-emitting device according to claim 1, wherein the coating film is made of a modified polyamide-imide.

3. The light-emitting device according to claim 1, wherein the coating film has a non-affinity to the bonding member.

4. The light-emitting device according to claim 1, wherein a height from the upper surfaces of the plurality of base materials to a bottom surface of the at least one light-emitting element is higher than a height from the upper surfaces of the plurality of base materials to an upper surface of the thin film portion.

5. The light-emitting device according to claim 1, further comprising:
   a frame body disposed on an outer peripheral portion of the upper surface of the coating film, the frame body including an annular frame base material coated with the coating film, the frame base material being made of a material same as the material of the plurality of base materials,
   wherein the opening portion has a shape approximately same as a shape of the at least one light-emitting element.

6. A method for manufacturing a light-emitting device, comprising:
- a substrate forming step of forming a plurality of plate-shaped base materials that are arranged side by side to be mutually spaced and are each made of a metal, and forming an insulating coating film formed so as to cover an upper surface and a side surface of each of the plurality of base materials, the coating film being provided with an opening portion that exposes one region of the upper surface of one base material among the plurality of base materials, the coating film including a binding portion mutually binding the plurality of base materials;
- a plating step of providing a placing pad made of a metal so as to cover the one region of the upper surface of the one base material; and
- an element bonding step of placing at least one light-emitting element on the placing pad via a bonding member,
- wherein in the substrate forming step, a thin film portion in which the coating film is formed in a thin film so as to surround an outer peripheral end of the opening portion is formed in the coating film.

7. The method for manufacturing a light-emitting device according to claim 6, wherein the coating film and the binding portion are formed on the plurality of base materials by electrodeposition coating.

8. The method for manufacturing a light-emitting device according to claim 6, wherein:
- the thin film portion and the opening portion of the coating film are formed by removing the coating film by the irradiation of a laser beam to the coating film, and
- the thin film portion is formed by irradiating a laser irradiation region including the one region of the coating film and extending outward from a peripheral area of the one region with the laser beam, and the opening portion is formed by irradiating the one region in the laser irradiation region with the laser beam again to partially remove the thin film portion.

* * * * *